United States Patent [19]
Kaepp et al.

[11] Patent Number: 5,748,943
[45] Date of Patent: May 5, 1998

[54] INTELLIGENT CAD PROCESS

[75] Inventors: Gregory A. Kaepp, Dearborn; Beverly J. Becker, Harper Woods, both of Mich.

[73] Assignee: Ford Global Technologies, Inc., Dearborn, Mich.

[21] Appl. No.: 538,925

[22] Filed: Oct. 4, 1995

[51] Int. Cl.$^6$ ................................................. G06F 17/50
[52] U.S. Cl. ..................... 395/500; 395/10; 395/919; 364/468.03; 364/468.1; 364/474.15; 364/474.22; 364/474.24
[58] Field of Search .......................... 395/500, 10, 919; 364/148, 522, 513, 468, 474.24, 152, 491, 490, 468.03, 474.15, 474.22

[56] References Cited

U.S. PATENT DOCUMENTS

| | | | |
|---|---|---|---|
| 4,875,162 | 10/1989 | Ferriter et al. | 364/401 |
| 4,910,660 | 3/1990 | Li | 364/148 |
| 4,922,432 | 5/1990 | Kobayashi et al. | 364/490 |
| 4,928,233 | 5/1990 | Millis | 364/522 |
| 4,939,668 | 7/1990 | Brown et al. | 364/513 |
| 5,019,992 | 5/1991 | Brown et al. | 364/468 |
| 5,079,690 | 1/1992 | Li | 364/148 |
| 5,297,054 | 3/1994 | Kienzle et al. | 364/474.24 |
| 5,309,366 | 5/1994 | Grenkowitz | 364/474.24 |
| 5,410,634 | 4/1995 | Li | 395/10 |
| 5,465,204 | 11/1995 | Sekine et al. | 364/152 |
| 5,515,524 | 5/1996 | Lynch et al. | 395/500 |
| 5,519,633 | 5/1996 | Chang et al. | 364/491 |
| 5,539,652 | 7/1996 | Tegethoff | 364/490 |
| 5,546,321 | 8/1996 | Chang et al. | 364/491 |
| 5,552,995 | 9/1996 | Sebastian | 364/468.03 |
| 5,555,406 | 9/1996 | Nozawa | 395/500 |

FOREIGN PATENT DOCUMENTS

| | | |
|---|---|---|
| 0 561 564 A2 | 9/1993 | European Pat. Off. . |
| 7-121603 | 5/1995 | Japan . |

OTHER PUBLICATIONS

"An Automatic Assembly Planning System", by Huang et al., IEEE, Robotics and Automation, 1990 International Conference, Jan. 1990, pp. 1594–1599.

"Product Design for Manufacturing: The Use of Knowledge Based Systems in Concurrent Engineering", by Gopalakrishnan et al. IEEE Systems, Man and Cybernetics, 1990 International Conference, Jun. 1990, pp. 566–568.

"A Reconstructive Approach to Automated Design Synthesis", by Wick et al., IEEE, VLSI, 1991 1st Great Lakes Symposium, pp. 307–311.

"A Framework of Knowledge–Based Assembly Planning", by Huang et al., Proceedings of the IEEE International Conference on Robotics and Automation, Apr. 1991, pp. 599–604.

(List continued on next page.)

Primary Examiner—Kevin J. Teska
Assistant Examiner—Russell W. Frejd
Attorney, Agent, or Firm—Joseph W. Malleck

[57] ABSTRACT

An adaptive CAD system, comprising: (a) gathering data consisting of at least one of (i) human generated information and techniques, and (ii) machine generated information and rules; (b) processing the gathered data by instructions to produce processed knowledge containing script without a product or part design; (c) recursively editing the processed knowledge to continuously improve the script to form an executable part design, such processing being carried out by inputting into the editing process at least one of (i) recently learned data, (ii) associative techniques, relations and features, and (iii) knowledge-based rules and instructions and (d) inputting the history of step (c) into processed knowledge, such inputting creating captured improvement criteria, that is iteratively and recursively feeding back into either the recursive editing process or into processing of step (b) to effect evolvement of an executable design form.

9 Claims, 8 Drawing Sheets

OTHER PUBLICATIONS

"Using Knowledge-Based Technology to Integrate CIM Databases", by Dilts et al., IEEE Transactions on Knowledge and Data Engineering, vol. 3, No. 2, Jun. 1991, pp. 237-245.

"Multiobjective Intelligent Computer-Aided Design", by Sykes et al., IEEE Transactions on Systems, Man, Cybermetics, vol. 21, No. 6, Nov./Dec. 1991, pp. 1498-1511.

"Development of Knowledge-Based (Expert) System (PECT) for Power Electronic Circuit Design", by Cumbi et al., IEEE, Power Electronics and Applications, 1993 European Conf. (IEE Conf. Pub. 377), pp. 74-79.

"Integration of Know-How in CAD/CAM Systems: A Way to Improve the Design Process", by Rharmaoui et al., IEEE, Industrial Electronics, Control and Instrumentation, 1993 Int'l. Conf., Mar. 1993, pp. 547-552.

"Knowledge-Based Integrated Design/Cost Systems", by Hill et al., Factory 2000—Advanced Factory Automation, 3-5 Oct. 1994, Conf. Pub. No. 398, IEE 1994, pp. 332-337.

"Qualitative Reasoning About Design Objects" Paul Veerkamp and Paul Ten Hagen *Robotics & Computer-Integrated Manufacturing*, vol. 10, No. 1/2 pp. 33-39, 1993.

"Computer Aided Design for Manufacture" Kenneth R. Halliday, XP 000654650, pp. 6-10.

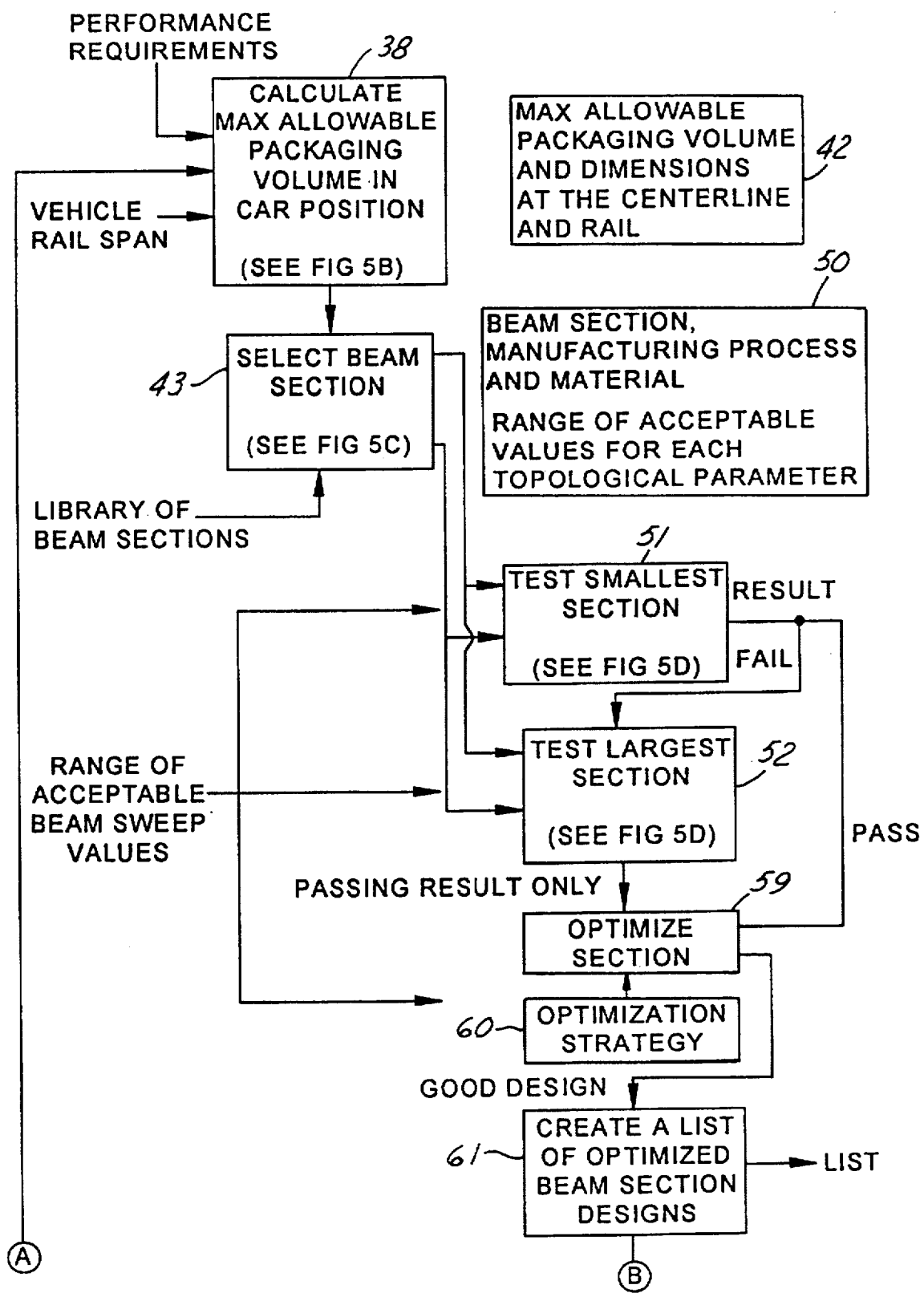
FIG.5A1

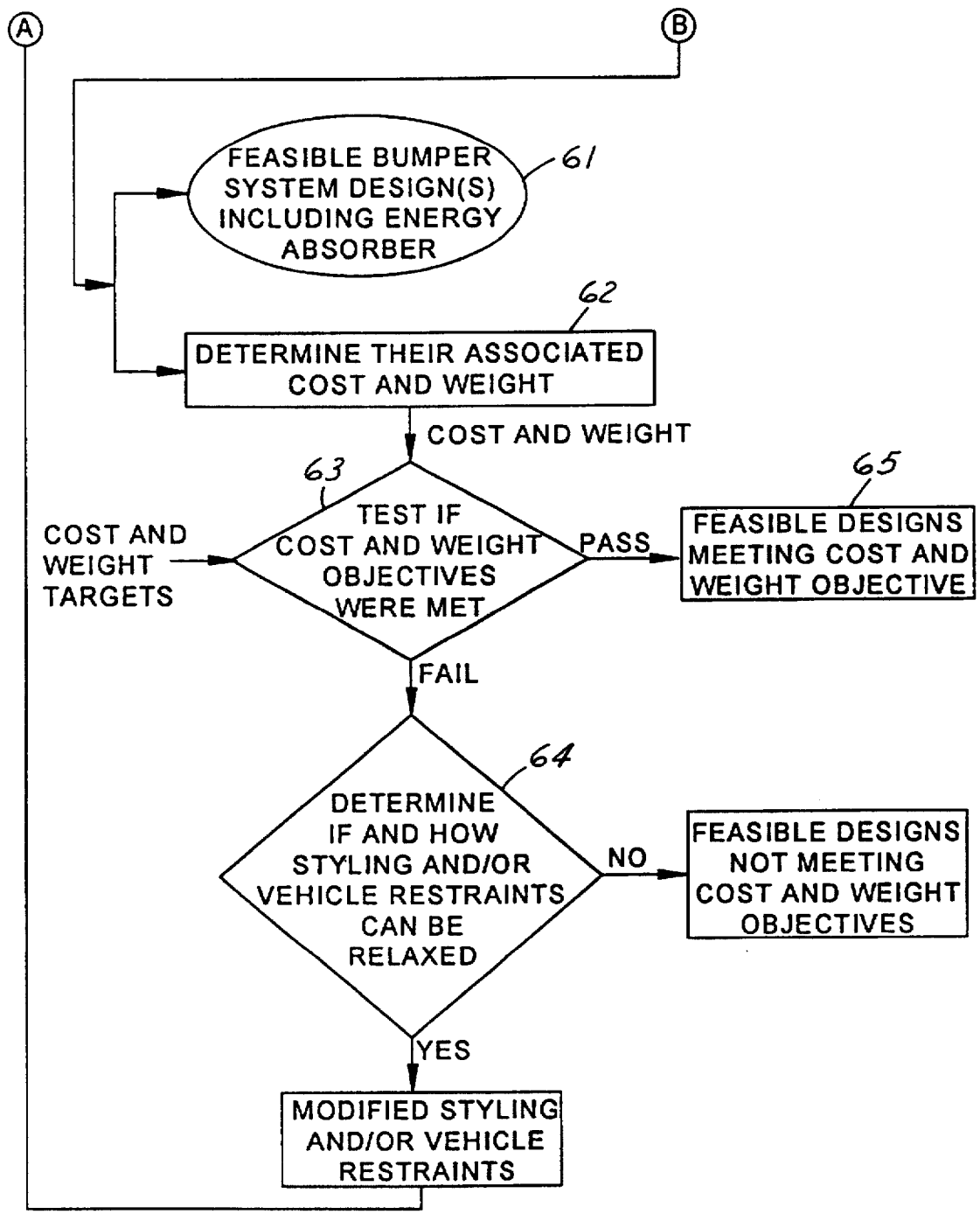
FIG.5A2

INTELLIGENT CAD PROCESS

BACKGROUND OF THE INVENTION

1. Technical Field

This invention relates to computer aided design, and more particularly to computer systems that embed product performance knowledge as a rule in computer aided design software programming.

2 Discussion of the Prior Art

It is conventional to use a find and fix mode to correct product designs after they have been placed in use. This is exemplified by computer aided drafting where the product design is created by instructions given to a computer via a designer's knowledge as input data; the computer aided drafting process organizes the input data and provides a deliverable in the form of an executed drawing. Field experience will tell if there is a problem due to factors such as environment, durability, customer satisfaction, damageability, recyclability, manufacturability, cost, features, finish, fit, and other internal and external influences. It is desirable to eliminate such problems up front during the design development process; the process should make the deliverable insensitive as much as possible to the aforementioned factors subsequently encountered.

Conceptual approaches that attempt to store knowledge of a product's performance fail to embed such knowledge in the rule making process that is an inherent part of the design development process. In such a storage system, a separate software product performs as an interface to the design process and asks questions of the designer who is the storehouse of information; the prior art process then draws a design from known components based upon such additional information to create only an initial design from known components. None of these concepts integrate updated product performance knowledge or specifications into the design development process to morphically and recursively change the design. The unknown design should evolve by continuous iteration based on cross-assessments of design influencing factors.

SUMMARY OF THE INVENTION

It is an object of this invention to embed product performance knowledge as a rule or as geometric parameters into a design and development process software program that not only stores knowledge from the development process but provides for two-way associativity influencing the design.

Another object of this invention is to use one or more of: rules, parameters, associativity, relations, and knowledge generated by the process, to revise and improve an unformed design as it is morphically developed.

A further object of this invention is to provide an intelligent CAD process that is capable of morphically changing the design shape of a part based upon its relation to other parts and other external influences.

The invention, meeting one or more of such objectives, is a method of evolving and dynamically adapting a computer aided product design having unknown initial form, comprising: (a) gathering data consisting of at least one of (i) human generated information and techniques, and (ii) machine generated information and rules; (b) processing the gathered data by instructions to produce processed knowledge containing script without a product design; (c) recursively editing the processed knowledge to continuously improve the script to form an executable part design by inputting into the editing process at least one of (i) recently learned data, (ii) associative techniques, relations and features, and (iii) knowledge-based rules and instructions, and (d) inputting the history of step (c) into processed knowledge, such inputting creating captured improvement criteria that is iteratively and recursively fed back into either the recursive editing process or into the processing of step (b) to effect evolvement of an executable design form.

BRIEF DESCRIPTION OF THE DRAWINGS

FIGS. 5A–5D depict subprocesses of FIG. 5.

DETAILED SPECIFICATION AND BEST MODE

Figure 1:
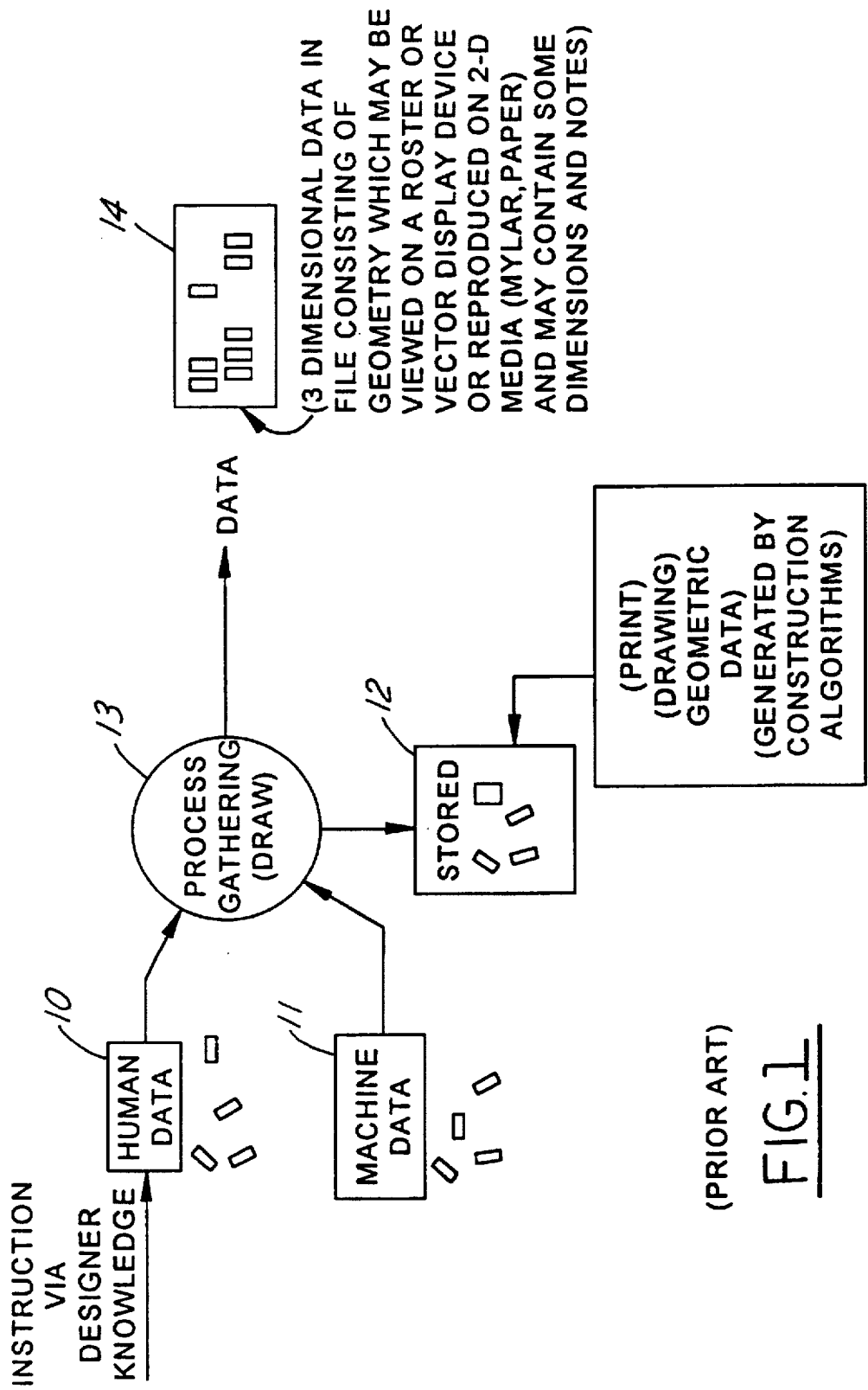
FIG. 1 is a schematic diagram of a conventional computer aided design process.

As shown in FIG. 1, unorganized human data 10, unorganized machine data 11 and previously stored data 12 are put into a computer gathering process 13; the gathering process calculates, makes calculations, observations and measures to provide organized knowledge 14. In the case of computer aided drafting, the human data 10 would be a designer's instructions based upon skill and prior work steps performed by the designer. The stored data 12 would be previous prints, drawings, layouts and geometric data generated by algorithms. The stored data may also include features: rounds, fillets, bosses, slots, customizing aspects, or parametric (indefinite) dimensions. The organized knowledge 14 can be a three-dimensional data file having a viewable geometry displayable on a raster or vector device.

Figure 2:
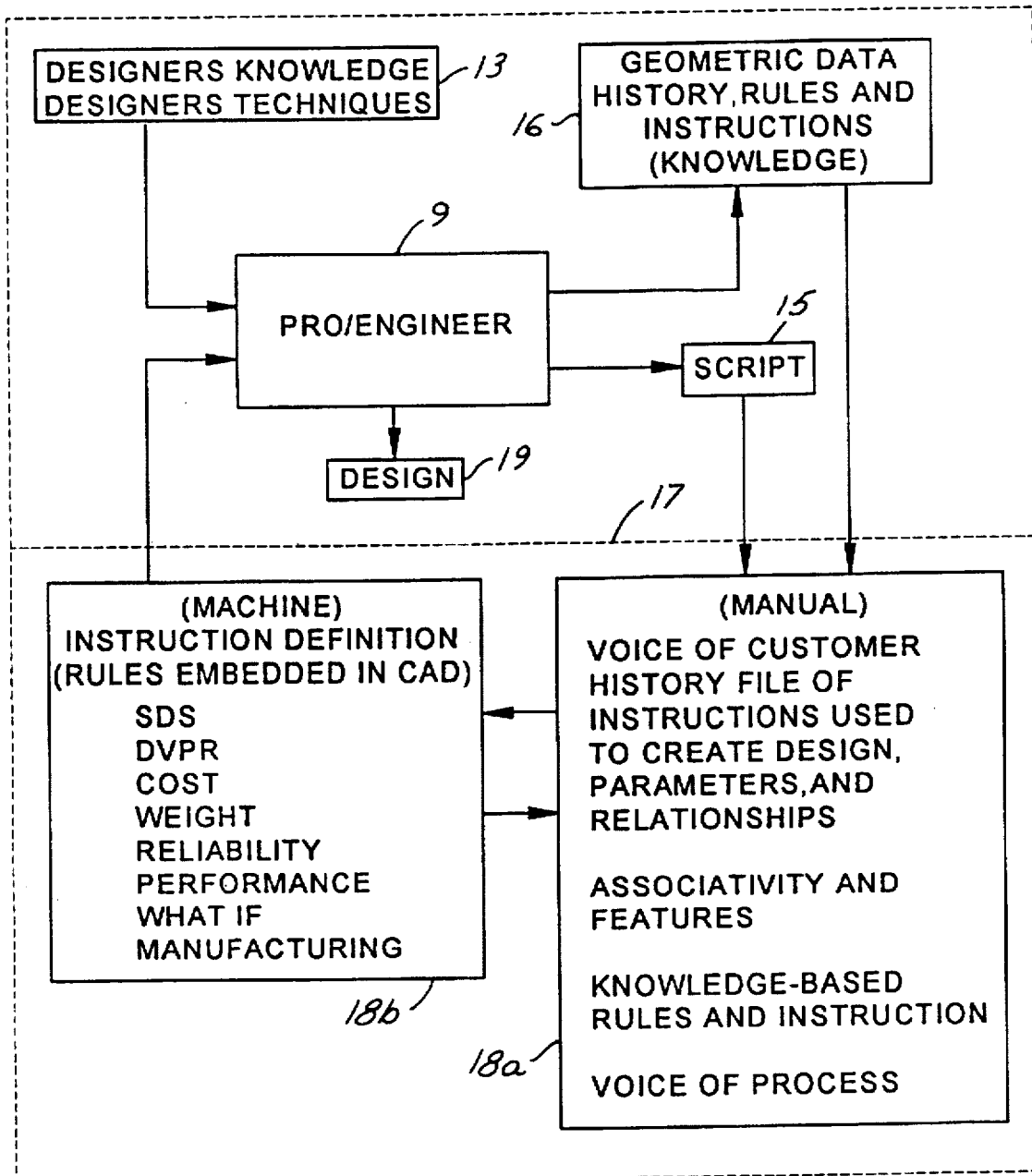
FIGS. 2 and 3 are schematic representations of the Intelligent CAD system of this invention.
Figure 3:
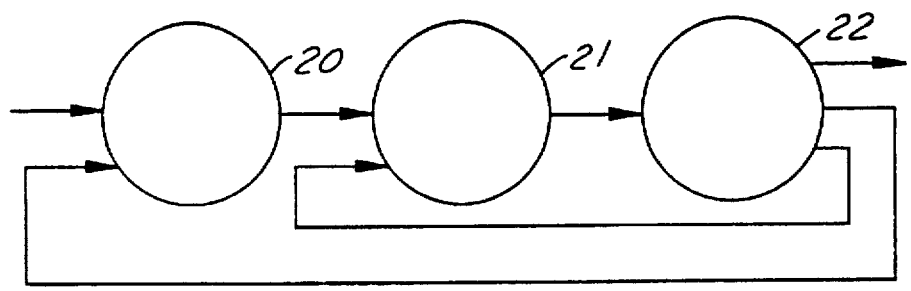

The invention, as shown in FIG. 2, not only goes through the gathering step 13 as described in FIG. 1, but additionally goes through an organizing or processing step 9 that provides script as a deliverable along with data 16 that together define an inchoate design. The script is an executable set of instructions created by the organizing step. Such script and/or data is then subjected to an iterative editing process 17 (manual or machine) using special stored information 18a or 18b to affect the inchoate design and eventually produce an executable 19 in the form of a viewable geometry of the part as well as new script. The editing process 17 may take place in several subprocesses 20, 21, 22, etc., each dedicated to a specific function that responds to new current information on such function such as illustrated in FIG. 3.

Figure 4:
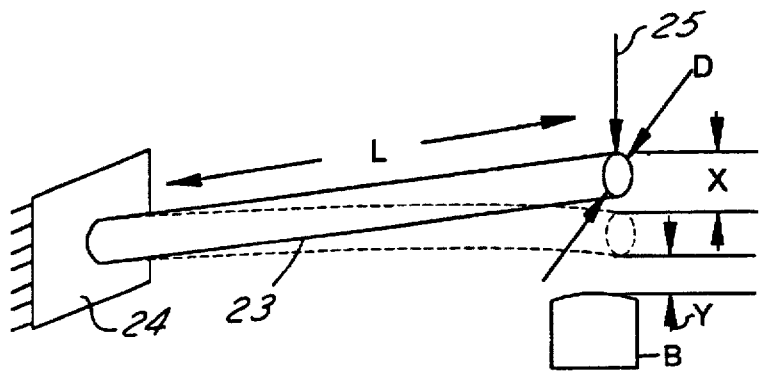
FIG. 4 is a schematic representation of a cantilevered beam to be designed illustrating embedment of associativity principles.

The example of a part to be designed, as shown in FIG. 4, utilizes a cantilevered beam 23 supported on a fixed surface 24 prescribed to support a load 25 with beam deflection not to exceed X. The beam length is to be no less than L; the diameter is to be no greater than D, and the material is aluminum (an environmental consideration). The beam is not to contact part B and the clearance Y is not to be encroached. Loads may be associated (related) to an arbitrary set of geometric entities possessing parameters and features; in the case of the beam this will be a set of points, lines, surfaces, etc. and the sets will contain subsets. There are several associative considerations: part to part, part to environment (non-geometric), geometry to part, etc. When loads are assigned to geometric entities, the geometry becomes associated to the environment. Relations may be written whereby environmental factors influence the design criteria, e.g. dimensions. Thus, using subprocesses for consideration such as manufacturability, costs, all constrained by such factors as size, section properties, area, and volume, the subprocesses will provide a two-way influence on the design by precipitating instructions which in turn executes the process which thereby influences the design.

Turning now to engine 5, the flow process for carrying out intelligent CAD design of a vehicular front bumper is laid out in broad terms.

The broad steps involve (30) creating an initial front bumper design, (31) optimizing the initial front bumper design (32) generating the protection zone layout, (33) building and testing prototypes, and (34) correlating finite element analysis results to the physical tests. A breakdown of subprocesses under these broad steps to carry out the intelligent CAD development design is given below.

1. Create an initial Front Bumper Design
   .1 Determine the Initial vehicle package constraints
   .2 Determine the initial bumper system design objectives
   .3 Generate alternative Bumper system designs
      .1 Generate initial Beam and energy absorber designs
         .1 Calculate maximum allowable packaging volume in car position
            .1 Determine the height of the beam in car position
            .2 Calculate the width of the bumper system
            .3 Calculate the depth of the bumper system at the centerline and frame sections
         .2 Select a Beam section
            .1 Determine the constraints on the beam geometry due to packaging and performance testing
            .2 Select a Beam section from the Beam section library
            .3 Check if the beam section supports the required dimensions
            .4 Calculate the range of acceptable values for each topological parameter
         .3 Test the smallest beam section
            .1 Calculate the required geometry and dimensions of the energy absorber
            .2 Select and energy absorber from the Energy Absorber library
            .3 Check if the energy absorber supports the required dimensions
            .4 Select the type of rail support
            .5 Check the Structural integrity of every combination of energy absorber and rail support for that particular section and its assigned dimensions by means of a lumped mass analysis
         .4 Test the largest Beam section if necessary
         .5 Optimize the beam section if necessary
         .6 Create a list of optimized bumper system designs
      .2 Determine their associated cost and weight
   .3 Test if cost and weight objectives were met
      .4 Determine if and how styling and/or vehicle constraints can be relaxed
   .4 Choose the best bumper system design
2. Optimize the initial Front Bumper Design
3. Generate the Protection zone Layout
   .1 Calculate the system stroke for each pendulum impact location
   .2 Calculate the stroke zone
   .3 Generate the Protection zone layout
4. Build and Test Prototypes
5. Correlate Finite Element Analysis Results to Physical Tests Subprocesses 1.1 and 1.2 respectively comprise determining the initial vehicle package constraints (35) and determining the initial bumper system designs (36). This will require considerable input of human generated information and techniques, as well as machine generated information and rules. For the bumper design development this will constitute cost and weight targets, styling requirements such as whether the bumper will have a certain type of curved shape and any styling theme facia for packaging constraints, radiator information that may require cooling slots in the bumper for the air conditioning condenser as a constraint, same information that may require the bumper to be capable of sustaining multiple 5 mph collisions as well as 30 mph crash or not violate a mandated approach angle, and other engine or package constraints, such as not violating an overall vehicle length.

Figure 5:
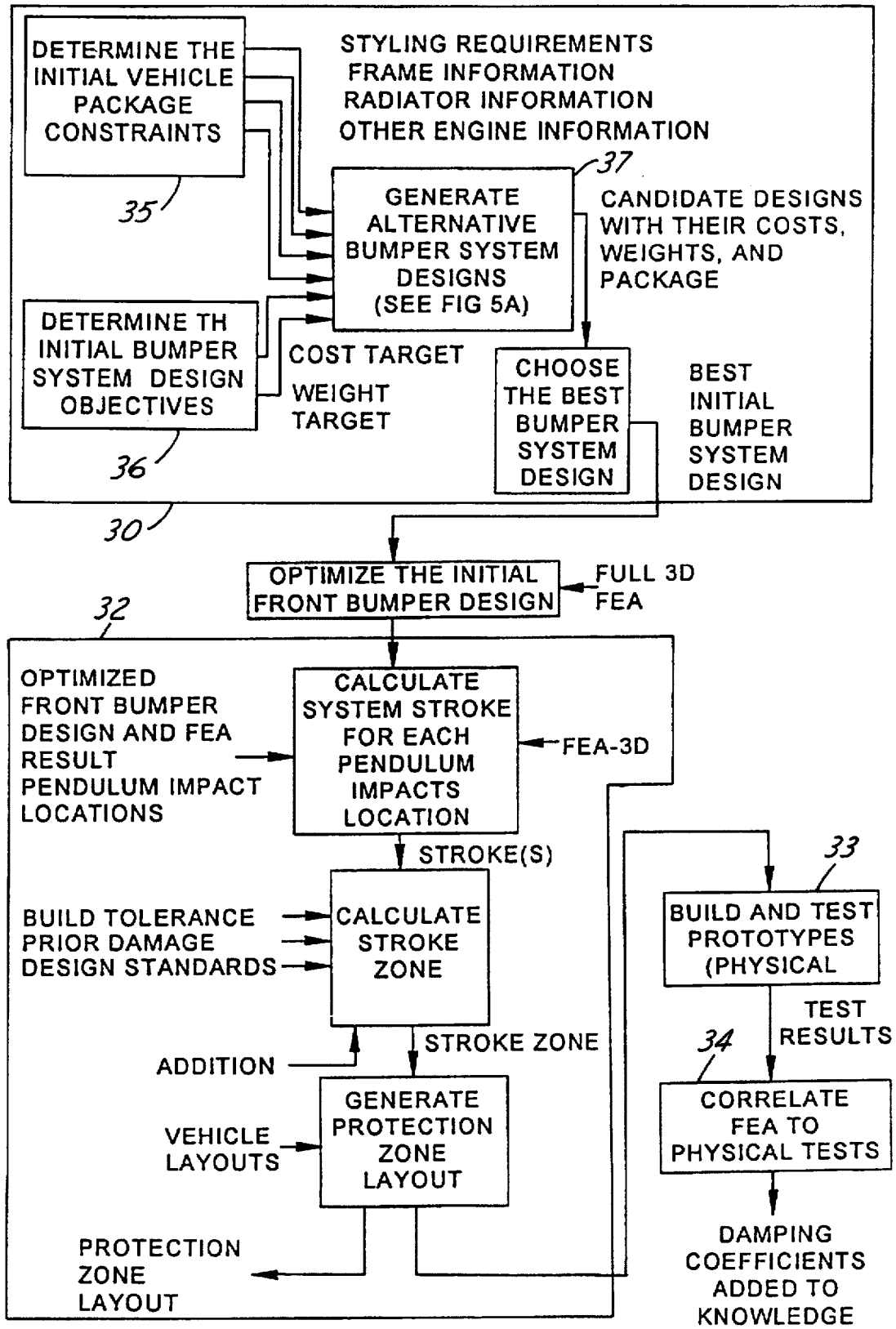
FIG. 5 is a flow diagram illustrating use of the intelligent CAD process of this invention to evolve a design of a motor vehicle bumper using embedded subprocesses to revise and improve an inchoate design of the bumper.
Figure 5B:
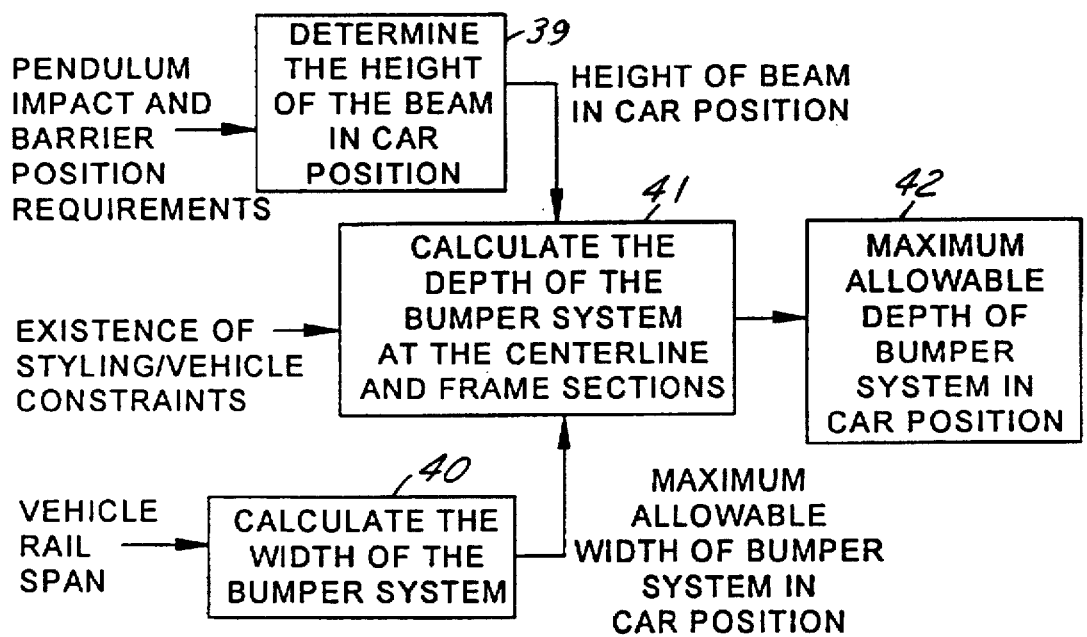

The inputted or gathered data is then processed to generate a bumper system design 37. First, the data is processed to produce processed knowledge containing script without a part design. This may involve calculating the maximum allowable packaging volume in the car position (38), see FIG. 5A, using input data as to performance requirements and vehicle rail span. This calculation subprocess may be broken down, as shown in FIG. 5B, into determining the height of the beam in car position (39) and calculating the width of the bumper system (40); the height width decision is fed along with styling and determining a tentative design 42 for the bumper system at the centerline and frame sections which renders a maximum allowable depth of bumper system in the car position.

With this tentatively processed information, a selection of a beam section is made (43) by the operator (see FIG. 5A) which begins iterative editing of the processed knowledge to continuously improve the tentative design or script. Step 43 is expanded upon in FIG. 5C and involves recursively editing by associative techniques, relations and features, such as the step 44 for determining the constraints on the beam geometry due to packaging and pendulum impact dimensions, using bumper system packaging information and impact barrier test requirements for beam height, depth and sweep. At the same time the processed information is edited by using input data that is knowledge-based rules and instructions, such as from a library 46, and which rules and instructions may incorporate recently learned data. With input data from the sections library, a selection and range 45 is checked to support the required dimensions (48). Then the range of acceptable values for each topological parameter is calculated (49) to produce a unique section 50 with associated manufacturing process and material with a defined range of acceptable topological parameters.

Figure 5C:
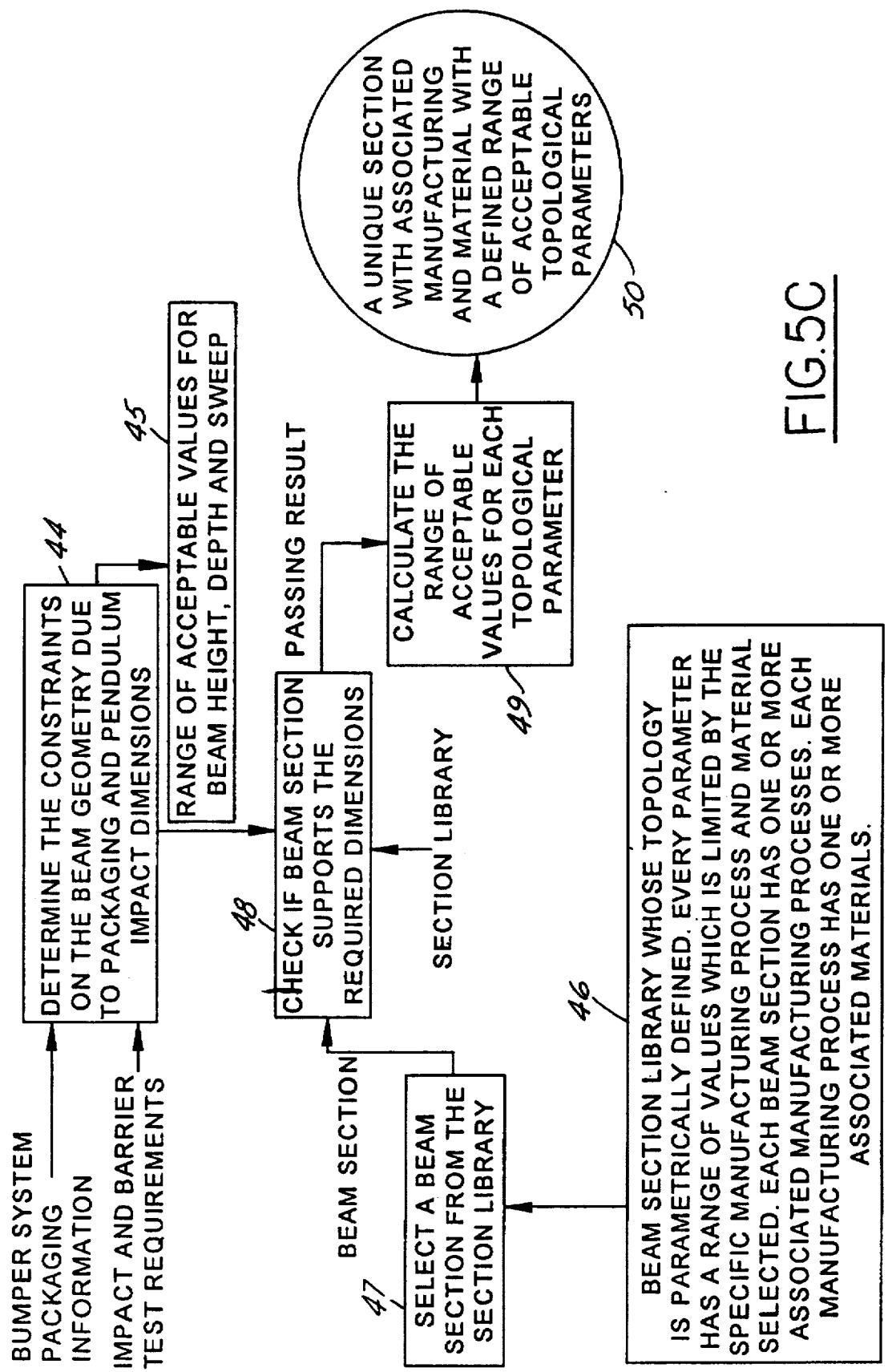
Figure 5D:
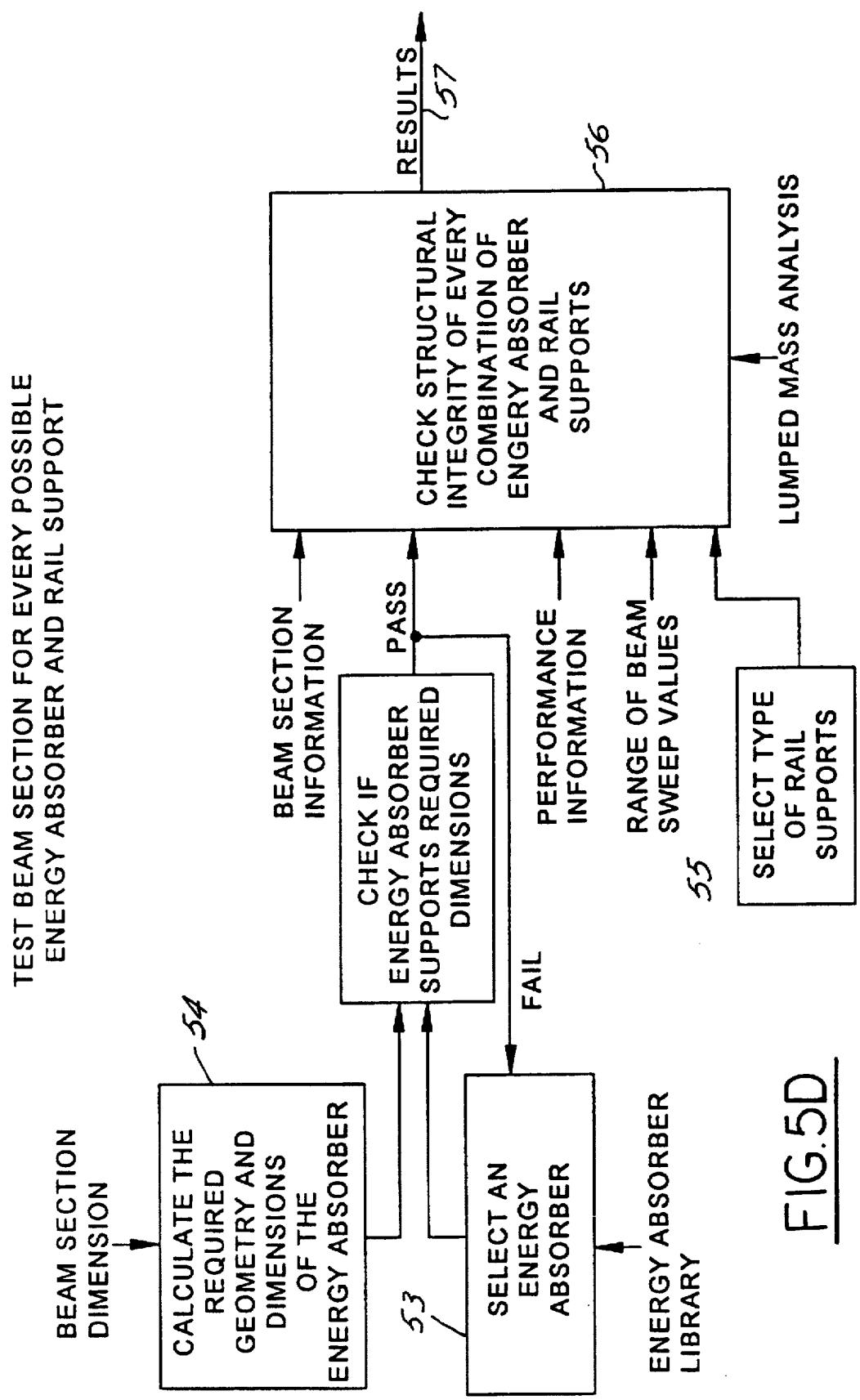

The unique section 50 is then tested by rules and instructions for every possible energy absorber and rail support, first as to the smallest section (51) and then as to the largest section (52). The testing of the selected beam section is expanded upon in figure 5D. A selection of the energy absorber is made from library (53) and then calculation of the required geometry and dimensions of the energy absorber is made (54). The results are checked to see if energy absorbed supports required dimensions. If the results fail, a new energy absorber is selected and this subprocess recursively carried out. If the results pass, a rail support is selected (55) and, along with beam section information, performance information, and acceptable range of beam sweep values, is checked as to structural integrity of every combination of energy absorber and rail support (56). This is lumped mass analysis to produce small section result 57. The same procedure in FIG. 5C is followed for the largest section (52) if necessary and the passed result (58), along with result 57, is fed to step 59 (FIG. 5A) for optimizing, if necessary, the section design based on input of optimization strategy rules and information 60. A list 61 of optimized bumper system designs is accumulated.

The feasible bumper system designs 61, including energy absorber is then analyzed as to meeting associated cost and weight (62) and then tested as to whether the objectives have been met (63). If not, a determination is made as to whether styling and/or vehicle constraints can be relaxed (64). If yes, the modified information is sent back for recursive use in the process; if not, the design is deemed not meeting the targets. This completes step 30 of FIG. 5. The other basic steps 31–34 follow in the order listed.

As explained above, the human interactive design process of the Intelligent CAD system triggers machine driven design subprocesses. The method may spawn one or more machine driven (non-human) processes involving calculation of the design worthiness, such as an initiation of an analysis (finite element method of structural analysis) for simulation of a 5 mph pendulum impact test; concurrently, a spawned machine driven process may generate another finite element analysis for the purpose of assessing 30 mph crash worthiness. Additionally, a design optimization executable may be spawned along with a mould flow analysis and a fatigue analysis while, at the same time, another executable is calculating material, piece and assembly cost. All these subprocesses (and more) may be initiated sequentially or concurrently and generate design knowledge never before available. Such knowledge is fed back, not only to refine the evolving design, but to add to the data base of accumulated knowledge which, in effect, becomes an ever increasing repository of bookshelf knowledge. This knowledge may be retrieved for future designs.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. A method of evolving and dynamically adapting a computer aided part design having unknown initial form, comprising: (a) gathering data related to said part consisting of (i) human generated information techniques, and (ii) machine generated information or rules; (b) processing the gathered data by instructions to produce processed knowledge containing script without a part design; (c) iteratively and recursively editing the processed knowledge to continuously adapt and improve the script to form one or more initial executable part designs by inputting into the editing process at least associative techniques, relations and features, and knowledge-based rules or instructions; and (d) inputting the editing history of step (c) into processed knowledge, such inputting creating captured improvement criteria that is iteratively and recursively fed back into either the recursive editing process or into the processing of step (b) to effect evolvement of a different executable design form.

2. The method as in claim 1, in which step (c) is carried out by inputting market acceptance information, product performance information, and updated targets for weight and costs.

3. The method as in claim 1, in which said associated techniques comprise relating the part design to adjacent parts of an assembly.

4. The method as in claim 1, in which said knowledge-based rules and instructions are associated with a library of design elements and sections.

5. The method as in claim 1, in which said iterative and recursive feeding back of said captured improvement criteria is carried out by computer software.

6. The method as in claim 1, in which step (c) is carried out by also inputting into the editing process recently learned data.

7. The method as in claim 1, which further comprises step (e) manually reviewing the initial executable design to determine if multiple design objectives have been met and if not, manually determining what script can be modified to recursively generate other executable design forms that attempt to meet said multiple design objectives.

8. The method as in claim 7, in which said manually determining involves using tradeoffs that compromise meeting all said multiple design objectives.

9. The method as in claim 1, in which step (c) comprises inputting information from customer wants for the part design, or complex environmental systems influencing the part design.

* * * * *